(12) United States Patent
Hasebe et al.

(10) Patent No.: US 9,351,397 B2
(45) Date of Patent: May 24, 2016

(54) RESIN COMPOSITION FOR PRINTED WIRING BOARD MATERIAL, AND PREPREG, RESIN SHEET, METAL FOIL CLAD LAMINATE, AND PRINTED WIRING BOARD USING SAME

(71) Applicant: MITSUBISHI GAS CHEMICAL COMPANY, INC., Tokyo (JP)

(72) Inventors: Keiichi Hasebe, Tokyo (JP); Seiji Shika, Tokyo (JP); Naoki Kashima, Tokyo (JP); Yoshinori Mabuchi, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 14/375,269

(22) PCT Filed: Jan. 24, 2013

(86) PCT No.: PCT/JP2013/051501
§ 371 (c)(1),
(2) Date: Jul. 29, 2014

(87) PCT Pub. No.: WO2013/115069
PCT Pub. Date: Aug. 8, 2013

(65) Prior Publication Data
US 2015/0014032 A1 Jan. 15, 2015

(30) Foreign Application Priority Data

Jan. 31, 2012 (JP) .................................. 2012-018958
Mar. 30, 2012 (JP) .................................. 2012-079615

(51) Int. Cl.
| H05K 1/00 | (2006.01) |
| H05K 1/03 | (2006.01) |
| C08K 3/00 | (2006.01) |
| C08L 63/00 | (2006.01) |
| C08G 59/40 | (2006.01) |
| C08G 59/24 | (2006.01) |
| H05K 1/05 | (2006.01) |
| H05K 1/11 | (2006.01) |

(52) U.S. Cl.
CPC ............ *H05K 1/0373* (2013.01); *C08G 59/245* (2013.01); *C08G 59/4014* (2013.01); *C08K 3/00* (2013.01); *C08L 63/00* (2013.01); *H05K 1/056* (2013.01); *H05K 1/115* (2013.01); *H05K 1/0366* (2013.01); *H05K 2201/0209* (2013.01); *Y10T 428/24355* (2015.01); *Y10T 428/24802* (2015.01); *Y10T 428/24917* (2015.01); *Y10T 428/31529* (2015.04)

(58) Field of Classification Search
CPC ........... H05K 1/00; H05K 1/03; H05K 3/386; H01L 23/28; H01L 23/48; H01L 23/488; B32B 15/08; C08G 59/40; C08G 59/68; C08G 73/00; C08G 73/06; C08L 79/00; C08L 79/04

USPC .............. 174/258, 256; 257/712, 774, 783; 428/209, 325, 327, 416, 418, 447, 463; 442/117, 181, 59, 233; 524/100, 101, 524/612; 525/502, 524, 423, 528
See application file for complete search history.

(56) References Cited

U.S. PATENT DOCUMENTS

| 4,804,740 | A | * | 2/1989 | Gardner et al. ............... 528/422 |
| 4,918,157 | A | * | 4/1990 | Gardner et al. ............... 528/322 |
| 4,931,496 | A | * | 6/1990 | Qureshi et al. ............... 524/612 |
| 5,385,989 | A | * | 1/1995 | Ohya ............................ 525/502 |
| 5,468,790 | A | * | 11/1995 | Papathomas ................. 524/100 |
| 5,536,765 | A | * | 7/1996 | Papathomas ................. 524/100 |
| 5,623,006 | A | * | 4/1997 | Papathomas ................. 524/100 |
| 6,097,089 | A | * | 8/2000 | Gaku et al. ..................... 257/712 |
| 6,194,495 | B1 | * | 2/2001 | Yeager et al. ................. 524/101 |
| 6,254,972 | B1 | * | 7/2001 | Farquhar et al. ............. 428/209 |
| 6,265,767 | B1 | * | 7/2001 | Gaku et al. ..................... 257/678 |
| 6,396,143 | B1 | * | 5/2002 | Kimbara et al. .............. 257/712 |

(Continued)

FOREIGN PATENT DOCUMENTS

| JP | 09-148748 | 6/1997 |
| JP | 2001-342230 | 12/2001 |

(Continued)

OTHER PUBLICATIONS

U.S. Application No. to Takabumi Oomori et al., which was filed on.

(Continued)

*Primary Examiner* — Xiaoliang Chen
(74) *Attorney, Agent, or Firm* — Greenblum & Bernstein, P.L.C.

(57) ABSTRACT

A resin composition forms a roughened surface with low roughness on an insulating layer regardless of roughening conditions when used as an insulating layer of a printed wiring board, and is excellent in adhesion between the insulating layer and a plated conductor layer, and also has low thermal expansion coefficient (linear expansion coefficient) and high glass transition temperature and is also excellent in moist heat resistance. The resin composition includes an epoxy compound, a cyanate ester compound and an inorganic filler, wherein the cyanate ester compound is at least selected from a naphthol aralkyl type cyanate ester compound, an aromatic hydrocarbon formaldehyde type cyanate ester compound, a biphenyl aralkyl type cyanate ester compound and a novolak type cyanate ester compound; and the content of the epoxy compound is 60 to 75% by weight based on the total amount of the epoxy compound and the cyanate ester compound.

18 Claims, No Drawings

(56) References Cited

U.S. PATENT DOCUMENTS

| | | |
|---|---|---|
| 6,528,236 B1 | 3/2003 | Fukase et al. |
| 7,014,731 B2 * | 3/2006 | Farquhar et al. ............ 156/307.5 |
| 7,255,925 B2 * | 8/2007 | Chung et al. .................. 428/416 |
| 2001/0005548 A1 * | 6/2001 | Farquhar et al. ................ 428/325 |
| 2001/0041389 A1 * | 11/2001 | Farquhar et al. ............. 438/118 |
| 2003/0003305 A1 * | 1/2003 | Japp et al. ..................... 428/413 |
| 2005/0019554 A1 * | 1/2005 | Orikabe et al. ............... 428/327 |
| 2005/0106370 A1 * | 5/2005 | Takai et al. ................... 428/209 |
| 2005/0182203 A1 * | 8/2005 | Sugano et al. ................ 525/423 |
| 2005/0202261 A1 * | 9/2005 | Takai et al. ................... 428/458 |
| 2006/0054589 A1 * | 3/2006 | Omori et al. .................... 216/13 |
| 2006/0084787 A1 * | 4/2006 | Sugano et al. ................ 528/422 |
| 2006/0099391 A1 * | 5/2006 | Tomioka et al. ............. 428/209 |
| 2007/0203308 A1 * | 8/2007 | Mori et al. .................... 525/524 |
| 2007/0264438 A1 | 11/2007 | Kawai |
| 2007/0277373 A1 * | 12/2007 | Takai et al. ..................... 29/829 |
| 2008/0138505 A1 * | 6/2008 | Takai et al. .................. 427/97.9 |
| 2008/0145689 A1 * | 6/2008 | Ogawa et al. ................ 428/607 |
| 2008/0187763 A1 * | 8/2008 | Kato et al. .................... 428/418 |
| 2009/0017316 A1 * | 1/2009 | Kato et al. .................... 428/447 |
| 2009/0110938 A1 * | 4/2009 | Nishimura et al. ........ 428/425.8 |
| 2009/0145766 A1 * | 6/2009 | Takai et al. ................... 205/112 |
| 2009/0203279 A1 * | 8/2009 | Mori et al. .................... 442/233 |
| 2009/0247032 A1 * | 10/2009 | Mori et al. .................... 442/181 |
| 2009/0306243 A1 * | 12/2009 | Kakutani et al. ............. 522/170 |
| 2010/0044086 A1 * | 2/2010 | Takai et al. ................... 174/257 |
| 2010/0051338 A1 * | 3/2010 | Takai et al. ................... 174/259 |
| 2010/0181684 A1 * | 7/2010 | Takahashi et al. ............ 257/774 |
| 2010/0193725 A1 * | 8/2010 | Rousse et al. .................. 252/62 |
| 2010/0227170 A1 | 9/2010 | Endo et al. |
| 2011/0014453 A1 * | 1/2011 | Ohigashi ....................... 428/221 |
| 2011/0084409 A1 * | 4/2011 | Sugino et al. ................ 257/783 |
| 2011/0139496 A1 * | 6/2011 | Nakamura .................... 174/256 |
| 2011/0147954 A1 * | 6/2011 | Kitamura ...................... 257/789 |
| 2011/0205721 A1 | 8/2011 | Endo et al. |
| 2011/0224333 A1 * | 9/2011 | Kitagawa et al. ............. 523/466 |
| 2011/0281126 A1 * | 11/2011 | Nozaki et al. ................. 428/458 |
| 2012/0018072 A1 * | 1/2012 | Ueno et al. ...................... 156/60 |
| 2012/0157573 A1 * | 6/2012 | Hirokane et al. ............. 523/400 |
| 2012/0164463 A1 * | 6/2012 | Tang et al. .................... 428/463 |
| 2012/0164464 A1 * | 6/2012 | Tang et al. .................... 428/463 |
| 2012/0165502 A1 * | 6/2012 | Hirokane et al. ............. 528/421 |
| 2012/0175159 A1 * | 7/2012 | Sakauchi et al. ............. 174/258 |
| 2013/0012088 A1 * | 1/2013 | Tiba et al. ..................... 442/117 |
| 2013/0040517 A1 | 2/2013 | Oomori et al. |
| 2013/0045650 A1 * | 2/2013 | Ogashiwa et al. .............. 442/59 |
| 2013/0136930 A1 * | 5/2013 | Kato et al. .................... 428/418 |
| 2013/0242520 A1 * | 9/2013 | Onozuka ....................... 361/783 |
| 2013/0281640 A1 * | 10/2013 | Tsubuku et al. .............. 525/528 |
| 2014/0017502 A1 * | 1/2014 | Kato et al. .................... 428/418 |

FOREIGN PATENT DOCUMENTS

| | | |
|---|---|---|
| JP | 2003-249751 | 9/2003 |
| JP | 2004-175925 | 6/2004 |
| JP | 2004-182850 | 7/2004 |
| JP | 2007-087982 | 4/2007 |
| JP | 2007-254709 | 10/2007 |
| JP | 2007-294487 | 11/2007 |
| JP | 2009-24056 | 2/2009 |
| JP | 2010-31263 | 2/2010 |
| JP | 2010-138364 | 6/2010 |
| JP | 2011-219674 | 11/2011 |
| WO | 2008/126411 | 10/2008 |
| WO | 2010/050472 | 5/2010 |
| WO | 2011/108524 | 9/2011 |

OTHER PUBLICATIONS

U.S. Appl. No. 14/130,741 to Naoki Kashima et al., filed Jan. 3, 2014.
Search report from International Bureau of WIPO PCT/JP2013/051501, mail date is Apr. 9, 2013.

* cited by examiner

RESIN COMPOSITION FOR PRINTED WIRING BOARD MATERIAL, AND PREPREG, RESIN SHEET, METAL FOIL CLAD LAMINATE, AND PRINTED WIRING BOARD USING SAME

TECHNICAL FIELD

The present invention relates to a resin composition which is useful as a material of an insulating layer of a printed wiring board, and a prepreg, a resin sheet, a metal foil clad laminate and a printed wiring board using such resin composition.

BACKGROUND ART

With the recent progress of miniaturization and high performances of electronic devices, microminiaturization of conductor wiring has advanced so as to improve mounting density of electronic components in a multilayer wiring board, and the wiring forming technology thereof has been desired. There have been known, as the method for forming high-density fine wiring on an insulating layer, an additive method in which a conductor layer is formed only by electroless plating, a semi-additive method in which a thin copper layer is formed over the entire surface by electroless plating and then a conductor layer is formed by electroplating, followed by flash etching of the thin copper layer, and the like.

Usually, when through holes or blind vias required for in-layer connection of a printed wiring board are formed by laser processing, in order to remove smear generated during the formation, a desmear treatment is carried out, a neutralization step being carried out using a reducing agent after undergoing a wet type treatment with a swellant and an oxidizing agent such as an alkali permanganic acid solution in the desmear treatment. In the semi-additive method, the wet type treatment may be sometimes used for the purpose of forming a comparatively large physical anchor on a surface of an insulating layer to ensure the strength of adhesion with a conductor layer to be formed thereon, in addition to the purpose of the removal of smear.

Large roughness of the surface of the insulating layer makes it impossible to completely remove plating from the depth physical anchor in a flash etching treatment at a late process, and thus it is desired to make roughness of the surface of the insulating layer as small as possible. On the other hand, small roughness of the insulating layer tends to cause a decrease in strength of adhesion between the conductor layer and the insulating layer. Thus, there is a need to use, as a resin composition serving as a material of the surface of the insulating layer, a resin composition having high strength of adhesion with the conductor layer even if the surface of the insulating layer has small roughness.

With the progress of miniaturization and high density of a multilayer printed wiring board, intensive study has been made on thinning of a laminate used in the multilayer printed wiring board. With the thinning, problems such as deterioration of mounting reliability and increase in warpage of the multilayer printed wiring board may arise, and thus it is required for the resin composition serving as the material of the insulating layer to have low thermal expansion and high glass transition temperature.

In order to solve such problems, Patent Literatures 1 to 4 mention technologies using, as the component of the resin composition serving as the material of the insulating layer, a rubber component and/or a filler which undergo(es) decomposition, falling-off or dissolution in an alkali permanganic acid solution which is an oxidizing agent during a desmear treatment. These literatures disclose that decomposition, falling-off or dissolution of the rubber and/or the filler cause fine unevenness on the surface of the insulating layer during the desmear treatment, leading to high force of adhesion between the conductor layer and the insulating layer, but make no mention of the concept of high glass transition temperature.

Patent Literature 5 discloses, as the resin component of the insulating layer, a resin composition containing a cyanate resin and/or a prepolymer thereof, an epoxy resin, a phenoxy resin, an imidazole compound and a filler. The resin composition achieved high plated copper peel strength of the conductor layer formed by plating, but did not achieve satisfactory low roughness and low thermal expansion.

CITATION LIST

Patent Literature

[PLT 1]
    Japanese Unexamined Patent Publication (Kokai) No. 2007-294487
[PLT 2]
    Japanese Unexamined Patent Publication (Kokai) No. 9-148748
[PLT 3]
    Japanese Unexamined Patent Publication (Kokai) No. 2007-254709
[PLT 4]
    Japanese Unexamined Patent Publication (Kokai) No. 2003-249751
[PLT 5]
    Japanese Unexamined Patent Publication (Kokai) No. 2007-87982

SUMMARY OF INVENTION

Technical Problem

The present invention has been made in view of the above problems, and an object thereof is to provide a resin composition which is excellent in adhesion between the insulating layer and a plated conductor layer, is capable of, when used as a material of an insulating layer of a printed wiring board, forming a roughened surface with low roughness on the surface of an insulating layer regardless of roughening conditions, has low thermal expansion coefficient (linear expansion coefficient) and high glass transition temperature, and is also excellent in moist heat resistance, and also to provide a prepreg, a resin sheet, a metal foil clad laminate and a printed wiring board using such resin composition.

Solution to Problem

The present inventors have obtained such finding that it is possible to obtain a resin composition comprising an epoxy compound, a cyanate ester compound and an inorganic filler, which is capable of, when used as a material of an insulating layer of a printed wiring board, forming a roughened surface with low roughness on the surface of an insulating layer regardless of roughening conditions, is excellent in adhesion between the insulating layer and a plated conductor layer, has low thermal expansion coefficient (linear expansion coefficient) and high glass transition temperature, and is also excellent in moist heat resistance, by selecting the cyanate ester compound from specific kinds and controlling a ratio of the epoxy compound to the total amount of the epoxy compound and the cyanate ester compound to a specific range in the resin composition. The present invention has been made based on such finding.

Namely, the gist of the present invention resides in a resin composition which is used as a material of an insulating layer of a printed wiring board including the insulating layer and a conductor layer formed by plating on a surface of the insulating layer, the resin composition comprising an epoxy compound (A), a cyanate ester compound (B) and an inorganic filler (C), wherein the cyanate ester compound (B) is at least one selected from the group consisting of a naphthol aralkyl type cyanate ester compound, an aromatic hydrocarbon formaldehyde type cyanate ester compound, a biphenyl aralkyl type cyanate ester compound and a novolak type cyanate ester compound, and the content of the epoxy compound (A) is 60 to 75% by weight based on the total amount of the epoxy compound (A) and the cyanate ester compound (B).

Another gist of the present invention resides in a prepreg including a base material, and the above resin composition attached to the base material.

Another gist of the present invention resides in a resin sheet including an external layer made of a metal foil or a metal film, and a layer of the above resin composition laminated on the external layer.

Another gist of the present invention resides in a metal foil clad laminate including the above prepreg, and a metal foil laminated on one or both surface(s) of the prepreg.

Another gist of the present invention resides in a printed wiring board produced by using the above prepreg, metal foil clad laminate or resin sheet as a build-up material.

Another gist of the present invention resides in a printed wiring board including an insulating layer, and a conductor layer formed on a surface of the insulating layer, wherein the insulating layer contains the above resin composition.

Advantageous Effects of Invention

The resin composition of the present invention exerts any one of the following effects (1) to (5), and preferably all effects:
(1) excellent adhesion between an insulating layer and a conductor layer to be formed on a surface of the insulating layer using plating,
(2) ability capable of forming a low-roughness roughened surface on a surface of an insulating layer,
(3) low thermal expansion coefficient (linear expansion coefficient),
(4) high glass transition temperature, and
(5) excellent moist heat resistance.

DESCRIPTION OF EMBODIMENTS

I. Resin Composition

A resin composition of the present invention is a resin composition which is used as a material of an insulating layer in a printed wiring board including the insulating layer, and a conductor layer formed by plating on a surface of the insulating layer, the resin composition containing an epoxy compound (A), a cyanate ester compound (B) and an inorganic filler (C).
[I-1. Epoxy Compound (A)]
In the resin composition of the present invention, the epoxy compound (A) is not limited as long as it has two or more epoxy groups in a molecule, and examples thereof include:
a biphenyl aralkyl type epoxy compound (epoxy group-containing biphenyl aralkyl resin), a naphthalene type epoxy compound (epoxy group-containing compound having a naphthalene skeleton: naphthalene difunctional epoxy compound),
a bisnaphthalene type epoxy compound (epoxy group-containing compound having a bisnaphthalene skeleton: naphthalene tetrafunctional epoxy compound),
an anthraquinone type epoxy compound (epoxy group-containing compound having an anthraquinone skeleton),
a naphthol aralkyl type epoxy compound (epoxy group-containing naphthol aralkyl resin),
a xylock type epoxy compound (epoxy group-containing xylock resin),
a bisphenol A type epoxy resin,
a bisphenol F type epoxy resin,
a bisphenol A novolak type epoxy resin,
a trifunctional phenol type epoxy compound (epoxy group-containing compound having a trifunctional phenol skeleton),
a tetrafunctional phenol type epoxy compound (epoxy group-containing compound having a tetrafunctional phenol skeleton),
a biphenyl type epoxy resin (epoxy group-containing compound having a biphenyl skeleton),
an aralkyl novolak type epoxy resin,
an alicyclic epoxy resin,
a polyol type epoxy resin,
a compound in which a double bond of a double bond-containing compound such as glycidylamine, glycidyl ester or butadiene is epoxidated, and
a compound obtained by a reaction of hydroxyl group-containing silicone resins with epichlorohydrin.

As exemplified above, in the present description, an epoxy compound having a structure obtained by epoxidating a certain resin or compound may sometimes be represented by the "XX type epoxy compound" attached to the name of the resin or compound thereof.

Among these compounds, the epoxy compound (A) is preferably one or two or more compound(s) selected from the group consisting of:
a biphenyl aralkyl type epoxy compound,
a naphthalene type epoxy compound,
a bisnaphthalene type epoxy compound,
an anthraquinone type epoxy compound,
a naphthol aralkyl type epoxy compound, and
a xylock type epoxy compound, from the viewpoint of adhesion between the insulating layer and the plated conductor layer, and flame retardancy.

The biphenyl aralkyl type epoxy compound is preferably a compound represented by the following formula (5):

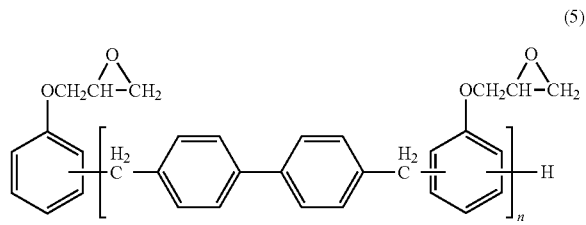

wherein n represents an integer of one or more, and the upper limit of n is usually 10, and preferably 7.

The naphthalene type epoxy compound is preferably a compound represented by the following formula (6):

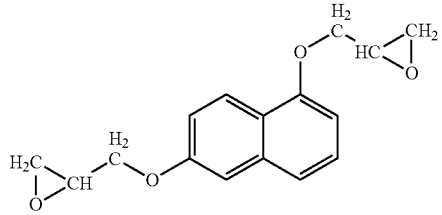

(6)

The bisnaphthalene type epoxy compound is preferably a compound represented by the following formula (7):

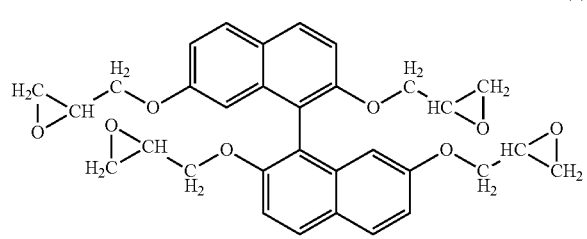

(7)

The anthraquinone type epoxy compound is preferably a compound represented by the following formula (9):

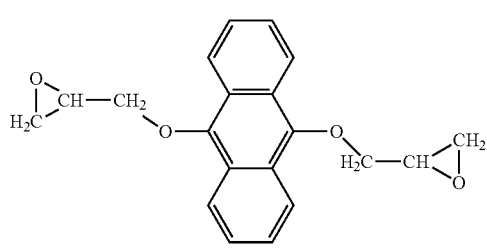

(9)

The naphthol aralkyl type epoxy compound is preferably a compound represented by the following formula (10):

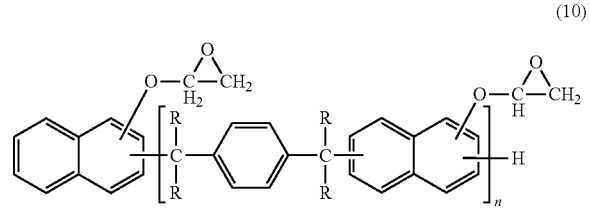

(10)

wherein R each independently represents a hydrogen atom or a methyl group, and n represents an integer of one or more.

The xylock type epoxy compound is preferably a compound represented by the following formula (11):

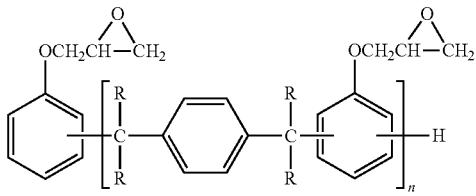

(11)

wherein R each independently represents a hydrogen atom or a methyl group, and preferably a hydrogen atom, and wherein n represents an integer of one or more, and the upper limit of n is usually 10, and preferably 6.

In the resin composition of the present invention, these epoxy compounds (A) may be used alone, or two or more compounds may be used in any combination at any ratio.

As the epoxy compound (A), ready-made products having various structures are commercially available and can be used after appropriately obtaining them. Using known various production methods, the epoxy compound (A) may be produced. Examples of such production method include a method in which a hydroxyl group-containing compound having a desired skeleton is obtained or synthesized, and then the hydroxyl group is modified by epoxidation (introduction of an epoxy group) using a known technique.

[I-2. Cyanate Ester Compound (B)]

In the resin composition of the present invention, the cyanate ester compound (B) is a compound having a cyanato group (cyanic ester group), and is specifically selected from the group consisting of:
a naphthol aralkyl type cyanate ester compound (cyanato group-containing naphthol aralkyl resin),
an aromatic hydrocarbon formaldehyde type cyanate ester compound (cyanato group-containing aromatic hydrocarbon formaldehyde resin),
a biphenyl aralkyl type cyanate ester compound (cyanato group-containing biphenyl aralkyl resin), and
a novolak type cyanate ester compound (cyanato group-containing novolak resin).

Since the cyanate ester compound (B) imparts excellent properties such as chemical resistance in the resin composition of the present invention, and thus the excellent chemical resistance enables to maintain the shape of a replica of a copper foil matte surface, thereby forming a uniform roughened surface, even if the surface of an insulating layer is subjected to a roughening treatment, it is possible to suitably use the cyanate ester compound (B) as a component of the resin composition of the present invention.

As exemplified above, in the present description, the cyanate ester compound (B) having a structure obtained by cyanation (conversion into a cyanate ester) of a certain resin or compound may sometimes be represented by the "XX type cyanate ester compound" attached to the name of the resin or compound thereof.

Among these compounds, the cyanate ester compound (B) is particularly preferably one, or two or more compound(s) selected from the group consisting of: a naphthol aralkyl type cyanate ester compound, an aromatic hydrocarbon formaldehyde type cyanate ester compound (preferably including, for example, a compound obtained by polymerizing an aromatic hydrocarbon such as benzene, toluene or xylene with formaldehyde to obtain an aromatic hydrocarbon formaldehyde resin, modifying the aromatic hydrocarbon formaldehyde resin with a hydroxyl group-containing aromatic hydrocarbon such as phenol or xylenol, and cyanating the hydroxyl group, a compound obtained by polymerizing a hydroxyl group-containing aromatic hydrocarbon such as phenol or xylenol with formaldehyde to obtain a hydroxyl group-containing aromatic hydrocarbon formaldehyde resin, and cyanating the hydroxyl group thereof, etc.), and a biphenyl aralkyl type cyanate ester compound, from the viewpoint of providing a composition of the present invention, which is excellent in flame retardancy and has high curability, and also ensures high glass transition temperature of a cured material.

The naphthol aralkyl type cyanate ester compound is preferably a compound represented by the following formula (1):

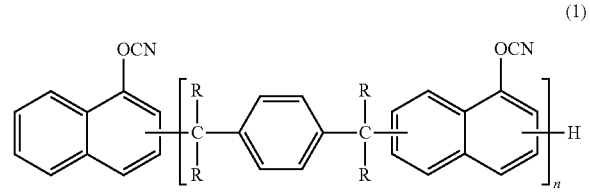

(1)

wherein R each independently represents a hydrogen atom or a methyl group, and preferably a hydrogen atom, and wherein n represents an integer of one or more, and the upper limit of n is usually 10, and preferably 6.

The aromatic hydrocarbon formaldehyde type cyanate ester compound is preferably a compound represented by the following formula (2):

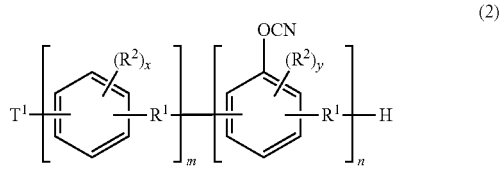

(2)

wherein $R^1$ each independently represents a methylene group, a methyleneoxy group, a methyleneoxymethylene group or an oxymethylene group;

wherein $R^2$ each independently represents a C1-3 alkyl group (preferably, a methyl group), a hydroxyl group or a hydroxymethylene group;

wherein $T^1$ represents a hydrogen atom, a hydroxyl group or a hydroxymethylene group;

wherein x each independently represents an integer of 0 to 4, and preferably 0 to 2;

wherein y each independently represents an integer of 0 to 3, and preferably 0 to 2;

wherein m represents an integer of 0 or more, and the upper limit of m being usually 50 or less, and preferably 20 or less;

wherein n represents an integer of one or more, preferably an integer of 2 or more, and the upper limit of n being usually 20 or less; and wherein each repeating unit is optionally arranged. Namely, the compound of the formula (2) may be either a random copolymer or a block copolymer. Two or more compounds of the formula (2) may be crosslinked and coupled to each other by the same groups as those of $R^1$.

More preferred aromatic hydrocarbon formaldehyde type cyanate ester compound is preferably a compound represented by the following formula (2'):

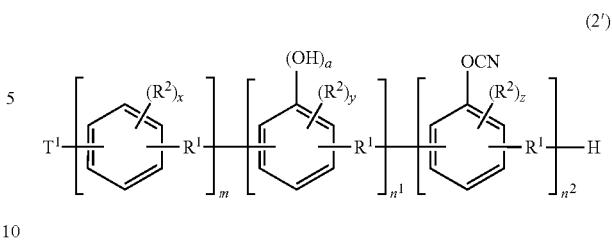

(2')

wherein $R^1$, $R^2$, $T^1$ are as defined above, and wherein x each independently represents an integer of 0 to 4, y and z each independently represents an integer of 0 to 3, a represents an integer of 0 or 1, m represents an integer of 0 or more, and $n^1$ and $n^2$ each independently represents an integer of one or more.

In the aromatic hydrocarbon formaldehyde type cyanate ester compound represented by the formula (2'), preferably, $R^2$ is a methyl group to form a phenol-modified xylene-formaldehyde resin (x=2, y=0, z=0) or a xylenol-modified xylene-formaldehyde resin (x=2, y=2, z=2). Examples of the structure or substructure thereof include, but are not limited to, compounds represented by the following formula (2"):

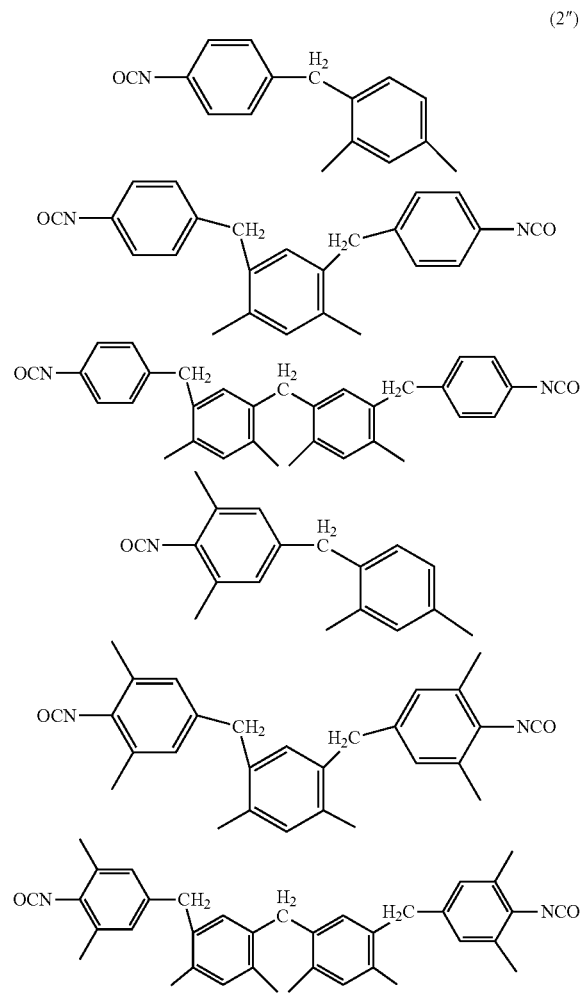

(2")

The mass average molecular weight of the aromatic hydrocarbon formaldehyde type cyanate ester compound is usually 250 to 5,000, and preferably 300 to 3,000. In the present description, the mass average molecular weight may be measured by an optional method, and is preferably measured by gel permeation chromatography (GPC).

The biphenyl aralkyl type cyanate ester compound is preferably a compound represented by the following formula (3):

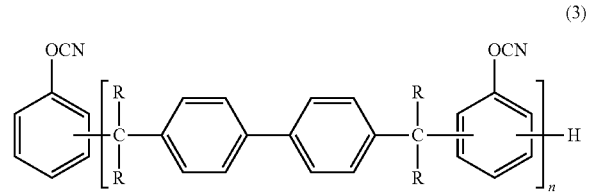

wherein R each independently represents a hydrogen atom or a methyl group, and preferably a hydrogen atom, and wherein n represents an integer of one or more, the upper limit of n being usually 10, and preferably 7.

The novolak type cyanate ester compound is preferably a compound represented by the following formula (4):

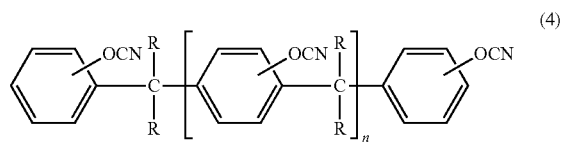

wherein R each independently represents a hydrogen atom or a methyl group, and preferably a hydrogen atom, and wherein n represents an integer of one or more, and the upper limit of n being usually 10, and preferably 7.

Among the compounds of the above formulas (1) to (4), the cyanate ester compound (B) is preferably compounds of the formulas (1) to (3), and particularly preferably a compound of the formula (1) or (2). It is particularly preferred that use of the aromatic hydrocarbon formaldehyde type cyanate ester compound of the formula (2) ensures further improvement in curability of the resin composition of the present invention, thus making it possible to obtain a cured material having excellent flame resistance.

In the resin composition of the present invention, these cyanate ester compounds (B) may be used alone, or two or more compounds may be used in any combination at any ratio.

It is also possible to use known cyanate ester compounds, except for the above-mentioned cyanate ester compound (B), alone, or to use two or more compound(s) in combination.

As the cyanate ester compound (B), ready-made products having various structures are commercially available and can be used after appropriately obtaining them. Using known various production methods, the cyanate ester compound (B) may be produced. Examples of such production method include a method in which a hydroxyl group-containing compound having a desired skeleton is obtained or synthesized, and then the hydroxyl group is modified by cyanation using a known technique. The technique for cyanation of a hydroxyl group includes, for example, the technique mentioned in Ian Hamerton, "Chemistry and Technology of Cyanate Ester Resins," Blackie Academic & Professional.

It is possible to produce the aromatic hydrocarbon formaldehyde type cyanate ester compound of the formula (2) by using, as specific examples of such production method, for example, a method in which a hydroxyl group-containing aromatic hydrocarbon formaldehyde resin having a corresponding structure is reacted with tertiary amine and cyan halide added simultaneously in the presence of a solvent which is separable from water, and then the reaction solution is washed with water and separated to obtain a solution, which is purified by precipitation using secondary or tertiary alcohols, or a poor solvent for hydrocarbon (see, for example, Japanese Patent No. 2,991,054), a method in which such hydroxyl group-containing aromatic hydrocarbon formaldehyde resin is reacted with cyan halide and tertiary amine in a two-phase system solvent of water and an organic solvent under acidic conditions (see, for example, Kokai (Japanese Unexamined patent Publication) No. 2007-277102), and the like.

The hydroxyl group-containing aromatic hydrocarbon formaldehyde resin serving as a raw material of the aromatic hydrocarbon formaldehyde type cyanate ester compound of the formula (2) can be obtained, for example, by a technique in which an aromatic hydrocarbon formaldehyde resin obtained by polymerizing an aromatic hydrocarbon such as benzene, toluene or xylene with formaldehyde is modified with a hydroxyl group-containing aromatic hydrocarbon such as phenol or xylenol, a technique in which a hydroxyl group-containing aromatic hydrocarbon such as phenol or xylenol is polymerized with formaldehyde, and the like. The former technique (modification with a hydroxyl group-containing aromatic hydrocarbon of an aromatic hydrocarbon formaldehyde resin) can be carried out, for example, by reacting an aromatic hydrocarbon formaldehyde resin (for example, a xylene-formaldehyde resin, etc.) with a hydroxyl group-containing aromatic hydrocarbon (for example, phenol, xylenol, etc.) in the presence of an acid catalyst. It is possible to use, as the acid catalyst, any of an inorganic acid such as sulfuric acid, hydrochloric acid or phosphoric acid, and an organic acid such as paratoluenesulfonic acid or methanesulfonic acid. The reaction temperature is usually 50 to 200° C. After the reaction, the objective product may be extracted with an organic solvent and recovered after neutralizing the acid catalyst with an alkali.

[I-3. Ratio of Epoxy Compound (A) to Cyanate Ester Compound (B)]

One of features of the resin composition of the present invention is that the content of the epoxy compound (A) is usually 60 to 75% by weight based on the total amount of the epoxy compound (A) and the cyanate ester compound (B). The above content is preferably 65 to 75% by weight, and more preferably 65 to 70% by weight. In general, as the content of the epoxy compound in the resin composition increases, adhesion between an insulating layer formed using a resin composition and a conductor layer formed on a surface thereof by plating is improved. However, since the glass transition temperature Tg of the insulating layer may decrease, leading to deterioration of heat resistance, and thus it is extremely difficult to achieve both properties. As shown in Examples mentioned below, it is possible to maintain the glass transition temperature Tg of the insulating layer at an extremely high value (for example, 180° C. or higher) while significantly improving adhesion between the insulating layer and the plated conductor layer, by using the above-mentioned specific cyanate ester compound (B), in addition to the epoxy compound (A), and controlling the ratio of the epoxy compound (A) within the limited range mentioned above. Thus, according to the resin composition of the present invention, it becomes possible to obtain the unexpected remarkable effect of achieving both excellent adhesion and high heat resistance at a high level. When two or more epoxy compounds (A) and/or two or more cyanate ester compounds (B) are used in combination, the total amount of them preferably satisfies the above content.

[I-4. Inorganic Filler (C)]

Specific examples of the inorganic filler (C) used in the resin composition of the present invention include, but are not particularly limited to, silicas (for example, natural silica, fused silica, amorphous silica, hollow silica, etc.), aluminum compounds (for example, boehmite, aluminum hydroxide, alumina, etc.), magnesium compounds (for example, magnesium oxide, magnesium hydroxide, etc.), calcium compounds (for example, calcium carbonate, etc.), molybdenum compounds (for example, molybdenum oxide, zinc molybdate, etc.), talcs (for example, natural talc, calcined talc, etc.), micas, glasses (for example, short fiber glass, spherical glass, fine powders of glass (for example, E-glass, T-glass, D-glass, etc.), etc.), and the like. These inorganic fillers (C) may be used alone, or two or more inorganic fillers may be used in any combination at any ratio.

Among these fillers, the inorganic filler (C) is suitably one, or two or more filler(s) selected from the group consisting of silica, aluminum hydroxide, boehmite, magnesium oxide and magnesium hydroxide.

From the viewpoint of low thermal expansion, the inorganic filler (C) is preferably silica, and particularly preferably fused silica. Specific examples of the silica include SFP-130MC manufactured by DENKI KAGAKU KOGYO KABUSHIKI KAISHA, SC2050-MB, SC2500-SQ and SC5500-SQ manufactured by ADMATECHS CO., LTD., and the like.

It is also preferred to use, as the inorganic filler (C), magnesium hydroxide and/or magnesium oxide alone, or a combination with other inorganic fillers such as silica. Magnesium hydroxide and magnesium oxide have the effect that they are eluted in a neutralization liquid in a desmear treatment of a surface of an insulating layer, thus forming a uniform roughened surface, leading to an improvement in plating peel strength. Specific examples of the magnesium hydroxide include "ECOMAG Z-10" and "ECOMAG PZ-1" manufactured by Tateho Chemical Industries Co., Ltd.; "Magseeds N", "Magseeds S", "Magseeds EP" and "Magseeds EP2-A" manufactured by Konoshima Chemical Co., Ltd.; MGZ-1, MGZ-3 and MGZ-6R manufactured by Sakai Chemical Industry Co., Ltd.; and "Kisma 5", "Kisma 5A" and "Kisma 5P" manufactured by Kyowa Chemical Industry Co., Ltd.; and the like. Specific examples of the magnesium oxide include FNM-G manufactured by Tateho Chemical Industries Co., Ltd.; SMO, SMO-0.1 and SMO-S-0.5 manufactured by Sakai Chemical Industry Co., Ltd.; and the like.

The average particle diameter of the inorganic filler (C) is not limited, and is preferably 0.01 to 5.0 µm, and more preferably 0.1 to 2.0 µm, from the viewpoint of obtaining uniform surface roughness after the desmear treatment. In the present description, the "average particle diameter" of the inorganic filler (C) means a median diameter of the inorganic filler (C). As used herein, the "median diameter" means the particle diameter in which the number or mass of particles at the side of a larger particle diameter and the number or mass of particles at the side of a smaller particle diameter, each accounts for 50% of all powders, when the particle size distribution of powders is divided into two regions based on a certain particle diameter. The average particle diameter (median diameter) of the inorganic filler (C) is measured by a wet type laser diffraction and scattering method.

There is no limitation on the amount of the inorganic filler (C) used and, when the total amount of the epoxy compound (A) and cyanate ester compound (B) is assumed as 100% by weight, the use rate of the inorganic filler (C) is preferably controlled within a range of 50 to 250% by weight, and more preferably 70 to 200% by weight, from the viewpoint of obtaining high plating peel strength while reducing high thermal expansion of the insulating layer. When two or more inorganic fillers (C) are used in combination, it is preferred that the total amount satisfies the above content.

[I-5. Bismaleimide (D)]

The resin composition of the present invention may contain, in addition to the epoxy compound (A), the cyanate ester compound (B) and the inorganic filler (C), a bismaleimide (D) from the viewpoint of improving moist heat resistance and glass transition temperature of the insulating layer.

The bismaleimide (D) is not limited as long as it is a compound having two or more maleimide groups, and specific examples thereof include bis(4-maleimidephenyl)methane, 2,2-bis{4-(4-maleimidephenoxy)-phenyl}propane, bis(3,5-dimethyl-4-maleimidephenyl)methane, bis(3-ethyl-5-methyl-4-maleimidephenyl)methane, bis(3,5-diethyl-4-maleimidephenyl)methane, and the like. It is also possible to use in the form of a prepolymer of these bismaleimides (for example, polyphenylmethane maleimide, etc.), or a prepolymer of these bismaleimides and an amine compound. These bismaleimides (D) may be used alone, or two or more bismaleimides may be used in any combination at any ratio.

Among these bismaleimides, the bismaleimide (D) is particularly preferably bis(3-ethyl-5-methyl-4-maleimidephenyl)methane or bis(3-ethyl-5-methyl-4-maleimidephenyl)methane, from the viewpoint of moist heat resistance and flame resistance.

When using the bismaleimide (D), the amount mixed is not limited. From the viewpoint of imparting high glass transition temperature and satisfactory flame resistance to the insulating layer while maintaining adhesion between the insulating layer and the plated conductor layer, the content of the bismaleimide (D) is preferably controlled within a range of 5 to 20% by weight, and more preferably 8 to 15% by weight, based on the total amount of the epoxy compound (A) and the cyanate ester compound (B). When using two or more bismaleimides (D) in combination, it is preferred that the total amount satisfies the above content.

[I-6. Other Components]

The resin composition of the present invention may contain, in addition to the epoxy compound (A), the cyanate ester compound (B) and the inorganic filler (C), as well as the bismaleimide (D) which is optionally used, other one, or two or more component(s).

For example, the resin composition of the present invention may contain a silane coupling agent for the purpose of improving moist heat resistance. The silane coupling agent is not limited as long as it is a silane coupling agent which is usually used in a surface treatment of an inorganic substance. Specific examples thereof include aminosilane-based silane coupling agents (for example, γ-aminopropyltriethoxysilane, N-β-(aminoethyl)-γ-aminopropyltrimethoxysilane, etc.), epoxysilane-based silane coupling agents (for example, γ-glycidoxypropyltrimethoxysilane, etc.), vinylsilane-based silane coupling agents (for example, γ-methacryloxypropyltrimethoxysilane, etc.), cationic silane-based silane coupling agents (for example, N-β-(N-vinylbenzylaminoethyl)-γ-aminopropyltrimethoxysilane hydrochloride, etc.), phenylsilane-based silane coupling agents, and the like. These silane coupling agents may be used alone, or two or more silane coupling agents may be used in any combination at any ratio.

When using the silane coupling agent, the amount mixed is not limited. From the viewpoint of improving moist heat resistance, the content of the silane coupling agent is preferably controlled within a range of 0.05 to 5% by weight, and more preferably 0.1 to 3% by weight, based on the inorganic filler (C). When using two or more silane coupling agents in combination, it is preferred that the total amount satisfies the above content.

The resin composition of the present invention may contain a moistness dispersing agent for the purpose of improving moldability. The moistness dispersing agent is not limited as long as it is a moistness dispersing agent which is usually used in a coating composition. Specific examples thereof include Disperbyk-110, Disperbyk-111, Disperbyk-180, Disperbyk-161, BYK-W996, BYK-W9010, BYK-W903, and the like manufactured by Big Chemie Japan Co., Ltd. These moistness dispersing agents may be used alone, or two or more moistness dispersing agents may be used in any combination at any ratio.

When using the moistness dispersing agent, the amount mixed is not limited. From the viewpoint of improving moldability, the content of the moistness dispersing agent is preferably controlled within a range of 0.1 to 5% by weight, and more preferably 0.5 to 3% by weight, based on the inorganic filler (C). When using two or more moistness dispersing agents in combination, it is preferred that the total amount satisfies the above content.

The resin composition of the present invention may contain a curing accelerator for the purpose of controlling a curing rate. The curing accelerator is not particularly limited as long as it is known as a curing accelerator such as an epoxy compound or a cyanate ester compound, and is usually used. Specific examples thereof include organometal salts containing metals such as copper, zinc, cobalt, nickel and manganese (for example, zinc octoate, cobalt naphthenate, nickel octoate, manganese octoate, etc.), imidazoles and derivatives thereof (for example, 2-ethyl-4-methylimidazole, 1-benzyl-2-phenylimidazole, etc.), tertiary amines (for example, triethylamine, tributylamine, etc.), and the like. These curing accelerators may be used alone, or two or more curing accelerators may be used in any combination at any ratio.

When using the curing accelerator, the amount mixed is not limited. From the viewpoint of obtaining high glass transition temperature, the content of the curing accelerator is preferably controlled within a range of 0.01 to 2% by weight, and more preferably 0.1 to 1% by weight, based on the total amount of the epoxy compound (A) and the cyanate ester compound (B). When using two or more curing accelerators in combination, it is preferred that the total amount satisfies the above content.

The resin composition of the present invention may contain other various polymeric compounds and/or flame retardant compounds as long as they do not impair the expected properties. The polymeric compound and the flame retardant compound are not limited as long as they are compounds which are usually used. Examples of the polymeric compound include various thermosetting resins and thermoplastic resins, as well as oligomer and elastomers thereof. Examples of the flame retardant compound include phosphorus-containing compounds (for example, phosphoric acid ester, phosphoric acid melamine, phosphorus-containing epoxy resin, etc.), nitrogen-containing compounds (for example, melamine, benzoguanamine, etc.), oxazine ring-containing compounds, silicone-based compounds, and the like. These polymeric compounds and/or flame retardant compounds may be used alone, or two or more polymeric compounds and/or flame retardant compounds may be used in any combination at any ratio.

The resin composition of the present invention may contain various additives for various purposes as long as they do not impair the expected properties. Examples of the additives include ultraviolet absorbers, antioxidants, photopolymerization initiators, fluorescent brighteners, photosensitizers, dyes, pigments, thickeners, lubricants, antifoaming agents, dispersants, leveling agents, brighteners, and the like. These additives may be used alone, or two or more additives may be used in any combination at any ratio.

[I-7. Others]

The resin composition of the present invention is prepared by mixing the components mentioned above, namely, an epoxy compound (A), a cyanate ester compound (B) and an inorganic filler (C), as well as a bismaleimide (D) which is optionally used, and other components. If necessary, the resin composition may take a form of a solution in which these components are dissolved in an organic solvent. Such solution of the resin composition of the present invention can be suitably used as a varnish when a prepreg and a resin sheet, which are mentioned below, of the present invention are produced. The organic solvent is not limited as long as it can suitably dissolve or disperse the respective components mentioned above, and does not impair the expected effect of the resin composition of the present invention. Specific examples thereof include alcohols (methanol, ethanol, propanol, etc.), ketones (for example, acetone, methyl ethyl ketone, methyl isobutyl ketone, etc.), amides (for example, dimethylacetamide, dimethylformamide, etc.), aromatic hydrocarbons (for example, toluene, xylene, etc.), and the like. These organic solvents may be used alone, or two or more organic solvents may be used in any combination at any ratio.

When used as a material of an insulating layer of a printed wiring board, the resin composition of the present invention is excellent in adhesion between the insulating layer and the plated conductor layer even if a roughened surface of the surface of the insulating layer has low roughness. Thus, it is possible to form a low-roughness roughened surface on the surface of the insulating layer regardless of roughening conditions. It is also possible to form an insulating layer which has low thermal expansion coefficient (linear expansion coefficient) and high glass transition temperature, and is also excellent in moist heat resistance. It is also possible to exert other suitable effects such as excellent chemical resistance. Thus, the resin composition of the present invention is extremely useful as a material of an insulating layer of a printed wiring board since it has various excellent features and can achieve both particularly excellent adhesion and high heat resistance at a high level.

II. Prepreg, Resin Sheet, Metal Foil Clad Laminate and Printed Wiring Board

All of a prepreg of the present invention, a resin sheet, a metal foil clad laminate and a printed wiring board are formed using the above-mentioned resin composition of the present invention.

[II-1. Prepreg]

The prepreg of the present invention is obtained by attaching the above resin composition of the present invention to a base material. It is possible to use, as the base material, a known base material which is usually used as a material of various printed wiring boards. Examples thereof include inorganic fibers such as fibers of glass (for example, E glass, D glass, S glass, NE glass, T glass, Q glass, etc.) and quartz, and organic fibers of polyimide, polyamide and polyester, and the base material can be appropriately selected according to the objective purposes and performances. Examples of the shape include a woven fabric, a nonwoven fabric, a roving, a chopped strand mat, a surfacing mat, and the like. Among these shapes, a glass fiber is preferable in view of strength and water absorbency, and a liquid crystal polyester woven fabric is preferable in view of electrical properties. The thickness of the base material is not limited and is preferably within a range of 0.01 to 0.3 mm. A glass woven fabric subjected to a surface treatment with a silane coupling agent, such as an epoxysilane treatment or an aminosilane treatment is suitable in view of moist heat resistance, and a woven fabric subjected to an ultra-opening treatment or a sealing treatment is suitable in view of dimensional stability.

Examples of the method of producing a prepreg of the present invention using the resin composition of the present invention in combination with the above base material include, but are not limited to, a technique in which a solution or dispersion (varnish) prepared by dissolving or dispersing the resin composition of the present invention in an organic solvent is impregnated into or applied on a base material, and semicured by heating (for example, heating in a dryer at 100 to 200° C. for 1 to 60 minutes, etc.) and/or drying under reduced pressure to remove the solvent, and then the resin composition of the present invention is attached to the base material. The amount of the resin composition adhered to the base material is preferably controlled so that the ratio of the resin composition of the present invention usually falls within a range of 15 to 95% by weight, and preferably 20 to 90% by weight, based on the entire prepreg.

The prepreg of the present invention can be used as a build-up material of the printed wiring board. As used herein, the "build-up" means that a printed wiring board having a multilayer structure is formed by laminating a prepreg or a resin sheet and repeating drilling and formation of wiring every layer. In the printed wiring board formed using the prepreg of the present invention, the prepreg of the present invention (a base material and the resin composition of the present invention attached thereto) composes the insulating layer. The printed wiring board is mentioned below.

[II-2. Resin Sheet]

The resin sheet of the present invention is obtained by laminating a layer made of the above-mentioned resin composition of the present invention on an external layer made of a metal foil or a metal film.

Examples of the metal foil or metal film to be used as the external layer include, but are not particularly limited to, a foil or film made of metal such as copper or aluminum. Among these metal foils or films, a copper foil or a copper film is preferable and, particularly, an electrolytic copper foil, a rolled copper foil, a copper alloy film, or the like can be suitably used. The metal foil or metal film may be subjected to a known surface treatment, for example, a nickel treatment, a cobalt treatment, or the like. The thickness of the metal foil or metal film can be appropriately controlled according to the intended purposes, and is suitable within a range of 5 to 70 µm.

Examples of the method for producing a resin sheet of the present invention by forming a layer made of the resin composition of the present invention (resin composition layer) on the above-mentioned external layer made of a metal foil or metal film include, but are not limited to, a technique in which a solution (varnish) prepared by dissolving or dispersing the resin composition of the present invention in an organic solvent is applied (application, impregnation, etc.) on a surface of the above-mentioned metal foil or film, and then the resin composition of the present invention is solidified by heating and/or drying under reduced pressure to remove the solvent, thus forming a resin composition layer, or the like. There is no particular limitation on drying conditions, and drying is performed so that the content of the organic solvent in the resin composition layer usually becomes 10 parts by weight or less, and preferably 5 parts by weight or less. Although the conditions attaining such drying vary depending on the amount of the organic solvent in the varnish, for example, a varnish containing 30 to 60 parts by weight of an organic solvent may be dried under heating conditions at 50 to 150° C. for about 3 to 10 minutes. The thickness of the resin composition layer in the resin sheet of the present invention is not limited, and is usually the thickness (usually about 5 to 70 µm, as mentioned above) of the external layer, and suitably within a range of 10 to 100 µm.

It is also possible to use the resin sheet of the present invention as the build-up material of the printed wiring board. In the printed wiring board formed using the resin sheet of the present invention, a layer made of the resin composition of the present invention composes the insulating layer. The printed wiring board is mentioned below.

[II-3. Metal Foil Clad Laminate]

The metal foil clad laminate of the present invention is obtained by laminating a metal foil on one or both surface(s) of the above-mentioned prepreg of the present invention. One prepreg of the present invention may be used, and two or more prepregs may be laminated.

Examples of the method for producing a metal foil clad laminate of the present invention include, but are not limited to, a technique in which one, or two or more prepreg(s) of the present invention is/are laminated and a metal foil is disposed on one or both surface(s) thereof, and then lamination molding is performed under conditions of a temperature of 180 to 220° C., for a heating time of 100 to 300 minutes under a contact pressure of 20 to 40 kgf/cm$^2$ (about 2.0 MPa to about 3.9 MPa), and the like.

The metal foil is not particularly limited and is preferably a metal foil, for example, a copper or aluminum foil, and particularly preferably a copper foil. Particularly, an electrolytic copper foil, a rolled copper foil, or the like can be suitably used. The metal foil may be subjected to a known surface treatment, for example, a nickel treatment, a cobalt treatment, or the like. The thickness of the metal foil can be appropriately controlled within a range suited as a material of the printed wiring board, and is suitably within a range of 2 to 35 µm.

From the viewpoint of transferring a matte surface of a metal foil to a surface of an insulating layer (layer made of the prepreg of the present invention) and increasing adhesion with a conductor layer to be formed by plating on the insulating layer by the anchor effect of unevenness transferred to the surface of the insulating layer, it is suitable to use a metal foil in which a matte surface has surface roughness Rz of 1.0 µm to 2.5 µm. As used herein, the "surface roughness Rz" is an indicator which shows roughness of the matte surface of the metal foil, and is usually determined in the following manner. Namely, a roughness curve of the face to be measured is usually measured by a laser microscope, and the 1st to 5th highest mountaintops exceeding an average line and the 1st to 5th lowest bottoms falling below the average line are respectively extracted, and then an average of absolute values of extracted mountaintop heights and ravine depths is calculated.

It is also possible to use the metal foil clad laminate of the present invention as the build-up material of the printed wiring board. In the printed wiring board formed using the metal foil clad laminate of the present invention, the prepreg of the present invention (a base material and the resin composition of the present invention attached thereto) composes the insulating layer. The printed wiring board is mentioned below.

[II-4. Printed Wiring Board]

The printed wiring board of the present invention is a printed wiring board including an insulating layer, and a conductor layer formed on a surface of the insulating layer, the insulating layer containing the resin composition of the present invention.

Such printed wiring board is obtained using the above-mentioned prepreg of the present invention and resin sheet or metal foil clad laminate as the build-up material. Namely, the printed wiring board is formed using them as the build-up material, whereby, the prepreg of the present invention (a base material and a resin composition of the present invention attached thereto), or the resin composition layer (a layer made of the resin composition of the present invention) of the resin sheet of the present invention composes the insulating layer containing the resin composition of the present invention.

Specifically, when the resin sheet of the present invention is used as the build-up material, the resin composition layer (insulating layer) of the resin sheet is subjected to a surface treatment by a conventional method and a wiring pattern (conductor layer) is formed by plating on a surface of an insulating layer, thus obtaining a printed wiring board of the present invention.

When the metal foil clad laminate of the present invention is used as the build-up material, a metal foil of a metal foil clad laminate is etched by a conventional method and a layer (insulating layer) made of the prepreg of the present invention is subjected to a surface treatment, and then a wiring pattern (conductor layer) is formed by plating on a surface of the insulating layer, thus obtaining a printed wiring board of the present invention.

When the prepreg of the present invention is used as the build-up material, it is used after forming into a metal foil clad laminate of the present invention by the above procedure. Alternately, when used as a material of a multilayer printed wiring board as mentioned above, it may be used in the original form.

In any case, other various steps (for example, a drilling treatment for forming a via hole, a through hole, etc.) may be optionally added.

Each step for production of the printed wiring board of the present invention will be described below.

The drilling treatment is carried out for formation of a via hole, a through hole, and the like. The drilling treatment is performed using any one of known methods such as NC drill machine, carbon dioxide laser, UV laser, YAG laser and plasma, or using two or more known methods in combination.

The surface treatment applied to the insulating layer is carried out from the viewpoint of improving adhesion between the insulating layer and the plated conductor layer, and removing smear. The surface treatment includes a roughening treatment, a silane coupling treatment, and the like, and the roughening treatment is preferably performed from the viewpoint of enhancing adhesion of plating. The roughening treatment also enables removal of smear generated during the drilling step. In this case, a roughened state varies depending on a difference in cure degree of the resin composition, and thus it is preferred to select, as the below-mentioned conditions of lamination molding, optimum conditions by a combination of the subsequent roughening treatment conditions and plating conditions.

The roughening treatment is composed of a swelling step, a surface roughening and smear dissolving step, and a neutralization step.

The swelling step is performed by swelling a surface insulating layer using a swelling treatment riquid. The swelling treatment riquid is not limited as long as it is capable of swelling a surface insulating layer to the extent where oxidative decomposition is promoted in the subsequent surface roughening and smear dissolving step as a result of an improvement in wettability of the surface insulating layer. Examples thereof include an alkali solution, a surfactant solution, and the like.

The surface roughening and smear dissolving step is performed using an oxidizing agent. The oxidizing agent includes, for example, a permanganate solution, and specific examples are suitably an aqueous potassium permanganate solution, an aqueous sodium permanganate solution, and the like. Such oxidizing agent treatment is called wet desmear, and dry desmear by a plasma treatment or a UV treatment, mechanical polishing by buff, and other known roughening treatments such as sandblasting may be carried out by appropriately using them in combination, in addition to the wet desmear.

The neutralization step is the step of neutralizing the oxidizing agent used in the previous step, using a reducing agent. The reducing agent includes an amine-based reducing agent, and specific examples thereof are suitably acidic reducing agents such as an aqueous hydroxylaminesulonate solution, an aqueous ethylenediaminetetraacetic acid solution and an aqueous nitrilotriacetic acid solution.

From the viewpoint of forming a fine wiring pattern, the smaller the surface unevenness of the insulating layer after the roughening treatment becomes, the better. Specifically, the surface unevenness is preferably 4.0 µm or less, and more preferably 2.0 µm or less, in terms of the Rz value. The surface unevenness after the roughening treatment is determined according to the cure degree of the resin composition, conditions of a roughening treatment, and the like, and thus it is preferred to select optimum conditions for obtaining desired surface unevenness. In particular, an insulating layer containing the resin composition of the present invention is extremely suitable since adhesion with a plated conductor layer can be ensured even in the case of low surface roughness.

Examples of the method of forming a wiring pattern (conductor layer) by plating include a semi-additive method, a full-additive method, a subtractive method, and the like. Among these methods, a semi-additive method is preferable from the viewpoint of forming a fine wiring pattern.

Examples of the technique of forming a pattern by the semi-additive method include a technique in which a thin conductor layer is formed by electroless plating on a surface of an insulating layer and electroplating is selectively applied using a plating resist (pattern plating), and then the plating resist is removed and the entire surface is etched in a proper quantity to form a wiring pattern.

Examples of the technique of forming a pattern by the full-additive method include a technique in which a pattern is formed in advance on a surface of an insulating layer using a plating resist, followed by selective electroless plating to form a wiring pattern.

Examples of the technique of forming a pattern by the subtractive method include a technique in which a conductor layer is formed by plating on a surface of an insulating layer, and then the conductor layer is selectively removed using an etching resist to form a wiring pattern.

In the case of forming a wiring pattern by plating, drying is preferably performed after plating from the viewpoint of improving the strength of adhesion between the insulating layer and the conductor layer. In the formation of a pattern by the semi-additive method, electroless plating is performed in combination with electroplating. In that case, drying is preferably performed after electroless plating and electroplating.

Drying after electroless plating is preferably performed at 80 to 180° C. for 10 to 120 minutes, while drying of electroplating is preferably performed at 130 to 220° C. for 10 to 120 minutes.

It is also possible to use a multilayer printed wiring board in place of the printed wiring board of the present invention. For example, a metal foil (for example, copper, aluminum, etc.) is disposed on both surfaces of the prepreg of the present invention by the above procedure to form a metal foil clad laminate of the present invention, and then an internal layer circuit is formed and the obtained circuit is subjected to a blackening treatment to obtain an internal layer circuit board. On one or both surface(s) of the thus obtained internal layer circuit board or metal foil (for example, a copper or aluminum foil), the prepreg or resin sheet of the present invention is disposed and also a metal foil (for example, a copper or aluminum foil) or mold releasing film (film in which a mold release agent is applied on a surface of a polyethylene film, a polypropylene film, a polycarbonate film, a polyethylene terephthalate film, an ethylene-tetrafluoroethylene copolymer film, or the like) is disposed on the outside thereof. Such operation is repeated, followed by lamination molding to produce a multilayer printed wiring board.

Lamination molding is performed using a technique which is usually used in lamination molding of a laminate for a printed wiring board, for example, a multistage pressing machine, a multistage vacuum pressing machine, a laminator, a vacuum laminator, an autoclave molding machine, or the like. The temperature is appropriately selected within a range of 100 to 300° C. and the pressure is appropriately selected within a range of 0.1 to 100 kgf/cm² (about 9.8 kPa to about 38 MPa), and the heating time is appropriately selected within a range of 30 seconds to 5 hours. If necessary, cure degree may be controlled by performing postcure at a temperature of 150 to 300° C.

EXAMPLES

The present invention will be described in detail below by way of Synthesis Examples, Examples and Comparative Examples, but the present invention is not limited thereto.

1. Production of Cyanate Ester Compound

Synthesis Example 1

Synthesis of α-Naphthol Aralkyl Type Cyanate Ester Compound (Compound of Formula (1a))

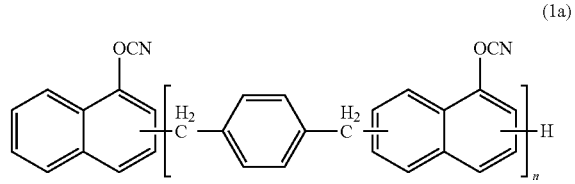

(1a)

wherein an average of n is 3 to 4

A reactor equipped with a thermometer, a stirrer, a dropping funnel and a reflux condenser was cooled in advance to a range of 0 to 5° C. using saline, and 7.47 g (0.122 mol) of cyan chloride, 9.75 g (0.0935 mol) of 35% hydrochloric acid, 76 ml of water and 44 ml of methylene chloride were charged therein.

While maintaining the temperature in the reactor at −5 to +5° C. and maintaining the pH at 1 or lower, under stirring, a solution prepared by dissolving 20 g (0.0935 mol) of α-naphthol aralkyl resin represented by the below-mentioned formula (1a') (SN485, OH group equivalent of 214 g/eq., softening point of 86° C., manufactured by Nippon Steel Chemical Co., Ltd.) and 14.16 g (0.14 mol) of triethylamine in 92 ml of methylene chloride was added dropwise over 1 hour by a dropping funnel. After completion of the dropwise addition, 4.72 g (0.047 mol) of triethylamine was further added dropwise over 15 minutes:

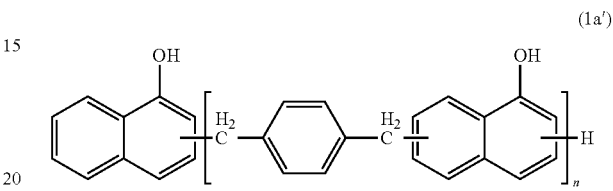

(1a')

wherein an average of n is 3 to 4.

After completion of the dropwise addition, the mixture was stirred at the same temperature for 15 minutes and then the reaction solution was separated, followed by isolation of the organic layer. The obtained organic layer was washed twice with 100 ml of water and methylene chloride was distilled off under reduced pressure by an evaporator, followed by final concentration to dryness at 80° C. for 1 hour to obtain 23.5 g of a cyanate ester compound (α-naphthol aralkyl type cyanate ester compound) of an α-naphthol aralkyl resin represented by the above formula (1a).

Synthesis Example 2

Synthesis of Phenol-Modified Xyleneformaldehyde Type Cyanate Ester Compound (Compound of Formula (2a))

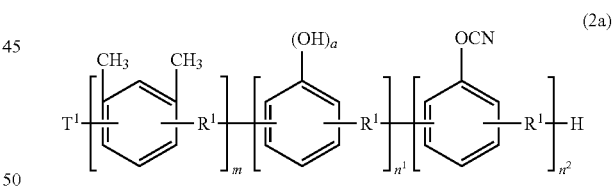

(2a)

wherein $R^1$, $T^1$, a, m, $n^1$ and $n^2$ have the same meanings as those described in the above-mentioned formula (2')

Examples of a structure or a substructure of the phenol-modified xyleneformaldehyde type cyanate ester compound include, but are not limited to, compounds represented by the following formula (2a').

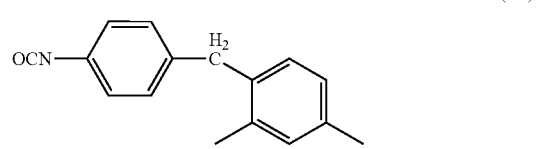

(2a')

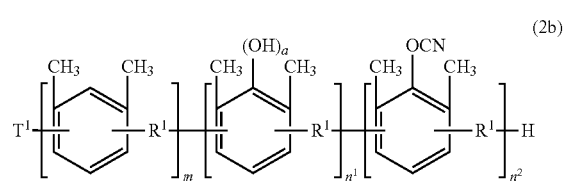

<Synthesis of Phenol-Modified Xylene-Formaldehyde Resin>

Phenol (800 g (8.5 mol)) and 0.43 g of a catalyst PTSA (paratoluenesulfonic acid) were charged, followed by stirring and temperature rising and further dropwise addition of 670 g of a xylene-formaldehyde resin (NIKANOL G, manufactured by Fudow Co., Ltd.) over 1 hour at a liquid temperature of 130° C. During dropwise addition, the reflux temperature decreased from 150° C. to 105° C. The reaction was completed within 1 hour after the dropwise addition. After the reaction, steam distillation for removal of phenol was carried out at 170° C. for 2.5 hours. While cooling, the reaction solution was diluted by slowly adding 1,700 g of methyl isobutyl ketone. The diluted solution was repeatedly washed three times with 850 g of warm water at 70 to 80° C.

The remaining solvent and a trace amount of phenol were distilled off by a distillation operation to obtain 1,130 g of a phenol-modified xylene-formaldehyde resin represented by the following formula (2a"):

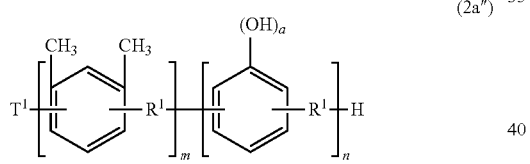

wherein $R^1$, $T^1$, m and a are as defined in the formula (2a), and n is as defined in the formula (2a) for $n^2$.

<Cyanation of Phenol-Modified Xylene-Formaldehyde Resin>

The phenol-modified xylene-formaldehyde resin (20 g (0.112 mol in terms of OH group)) of the formula (2a") obtained in the above method and 17.13 g (0.168 mol) of triethylamine were dissolved in 120 g of methylene chloride (solution 1). To the solution prepared by mixing 48.1 g of a methylene chloride solution of 0.249 mol of cyan chloride, 23.76 g (0.235 mol) of 36% hydrochloric acid and 147.3 g of water with stirring, the solution 1 was added dropwise at −5 to +5° C. over 10 minute. After stirring for 30 minutes, a mixed solution of 11.42 g (0.112 mol) of triethylamine and 11.4 g of methylene chloride was added dropwise, followed by stirring for 30 minutes, thus completing the reaction. The reaction solution was separated, followed by isolation of the organic phase. The obtained organic phase was washed four times with 100 g of water and then methylene chloride was distilled off by distillation to obtain 23.1 g of a cyanate ester compound (phenol-modified xyleneformaldehyde type cyanate ester compound) of a phenol-modified xylene-formaldehyde resin represented by the above formula (2a) as a yellowish red viscous substance.

The compound of the formula (2a) could be dissolved in methyl ethyl ethyl ketone at 25° C. in the amount of 30% by weight or more. Using Rheometer AR2000EX manufactured by TA Instruments, the viscosity was measured. As a result, the viscosity was 0.4 Pa·s at 100°. The mass average molecular weight (Mw) measured by GPC of the compound of the above formula (2a) was 1,050.

Synthesis Example 3

Synthesis of 2,6-Xylenol-Modified Xyleneformaldehyde Type Cyanate Ester Compound (Compound of Formula (2b))

$$\begin{array}{c}\text{(2b)}\end{array}$$

wherein $R^1$, $T^1$, a, m, $n^1$ and $n^2$ have the same meanings as described in the above-mentioned formula (2')

Examples of the structure or substructure of the phenol-modified xyleneformaldehyde type cyanate ester compound include, but are not limited to, compounds represented by the following formula (2b').

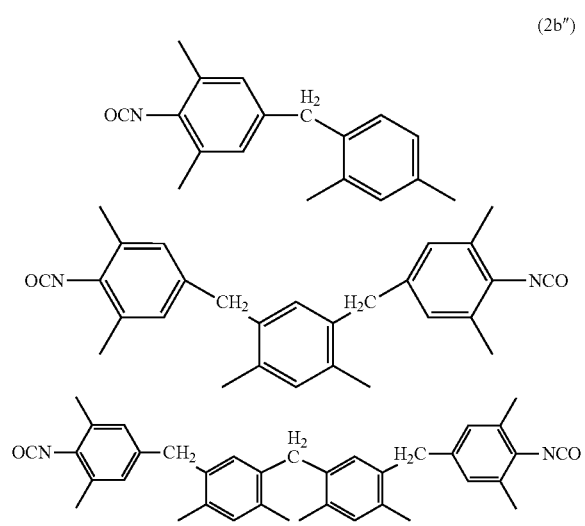

<Method for Synthesis of 2,6-Xyenol-Modified Xylene-Formaldehyde Resin>

2,6-xylenol (486.8 g (3.99 mol)) and 6.3 g of a catalyst PTSA (paratoluenesulfonic acid) were charged, followed by stirring and temperature rising. Upon reaching a liquid temperature of 125° C., 144 g of a xylene-formaldehyde resin (NIKANOL GL16, manufactured by Fudow Co., Ltd.) was added dropwise over 1 hour. During dropwise addition, temperature rising was continued, thus completing the reaction at 150° C. for 3 hours. After the reaction, the reaction solution was cooled to 120° C. or lower and 160 g of meta-xylene was added, and then the reaction solution was diluted by adding 240 g of methyl isobutyl ketone. The diluted reaction solution was repeatedly washed three times with 400 g of warm water at 70 to 80° C.

The solvent was removed and the unreacted 2,6-xylenol was distilled off by a distillation operation to obtain 362 g of a crude product of a 2,6-xylenol-modified xylene-formaldehyde resin represented by the following formula (2b"):

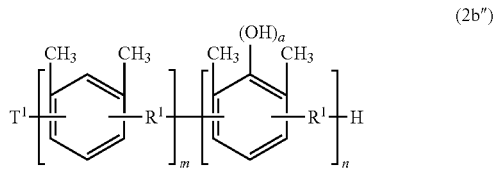

wherein $R^1$, $T^1$, m and a are as defined in the formula (2b), and n is as defined in the formula (2b) for $n_2$.

To 292 g of the obtained crude product, 300 g of meta-xylene was added and dissolved with stirring on a hit water bath (crystal partially remains), and then a crystal was precipitated under continuous stirring while cooling with iced water, and the crystal was removed by filtering through a G-3 filter. The solvent was distilled off from the filtrate to obtain 175 g of a purified product of a 2,6-xylenol-modified xylene-formaldehyde resin of the above formula (2b") by a distillation operation.

<Synthesis of Cyanated 2,6-Xyenol-Modified Xylene-Formaldehyde Resin (NXDC)>

A purified product (256 g (1.45 mol in terms of OH group)) of a 2,6-xylenol-modified xylene-formaldehyde resin of the formula (2b") obtained by the above method and 1.6 mol of triethylamine were dissolved in 600 mL of 3-methyltetrahydrofuran (solution 2). Thereafter, the solution 2 was added dropwise to 500 g of a methylene chloride solution of 2.8 mol of cyan chloride at −10° C. over 1.5 hours. After stirring for 30 minutes, a mixed solution of 0.8 mol of triethylamine and 115 g of methylene chloride was added dropwise, followed by stirring for 30 minutes, thus completing the reaction. A hydrochloride of triethylamine was removed by filtration and the obtained filtrate was washed with 1,000 mL of 0.1 N hydrochloric acid, washed three times with 1,000 mL of an aqueous NaCl solution, and finally washed with 1,000 mL of water. The methylene chloride solution was dried over sodium sulfate and methylene chloride was distilled off by a distillation operation to obtain 240 g of a cyanate ester compound (2,6-xylenol-modified xyleneformaldehyde type compound) of a 2,6-xylenol-modified xylene-formaldehyde resin represented by the above formula (2b) as a yellowish red viscous substance.

The compound of the formula (2b) could be dissolved in methyl ethyl ethyl ketone at 25° C. in the amount of 30% by weight or more. Using a rheometer AR2000EX manufactured by TA Instruments, the viscosity was measured. As a result, the viscosity was 0.3 Pa·s at 100°. The mass average molecular weight (Mw) measured by GPC of the compound of the above formula (2b) was 650.

2. Production of Resin Composition and Copper Clad Laminate

Example 1

Fifty (50) parts by weight (25 parts by weight in terms of non-volatile component) of a methyl ethyl ketone (hereinafter may sometimes to abbreviated to "MEK") solution (non-volatile component of 50% by weight) of an α-naphthol aralkyl type cyanate ester compound (cyanate equivalent of 261 g/eq.) of the formula (1a) obtained in Synthesis Example 1 as the cyanate ester compound (B), 100 parts by weight (75 parts by weight in terms of non-volatile component) of a MEK solution (non-volatile component of 75% by weight) of a biphenyl aralkyl type epoxy compound (NC-3000-FH, epoxy equivalent of 320 g/eq., manufactured by Nippon Kayaku Co., Ltd.) represented by the formula (5) as the epoxy compound (A), and 24 parts by weight (0.24 part by weight in terms of non-volatile component) of a MEK solution (non-volatile component of 1% by weight) of zinc octoate as the curing accelerator were dissolved or dispersed in MEK. Furthermore, 100 parts of silica (SFP-130MC, manufactured by DENKI KAGAKU KOGYO KABUSHIKI KAISHA, average particle diameter of 0.6 μm) was added as the inorganic filler (C), followed by stirring for 30 minutes using a high-speed stirrer to obtain a varnish (a solution of a resin composition containing an epoxy compound (A), a cyanate ester compound (B) and an inorganic filler (C)). This varnish was further diluted with MEK, applied to a 0.1 mm thick E glass woven fabric by impregnation coating and then dried by heating at 160° C. for 4 minutes to obtain a prepreg having a resin composition content of 50% by weight. After laying the thus obtained one, four or eight prepreg(s) one upon another and a matte surface of a 12 μm thick electrolytic copper foil (F1-WS, manufactured by Furukawa Electric Co., Ltd.) was disposed at the prepreg side and then lamination molding was performed under a pressure of 30 kgf/cm² (about 2.9 MPa) at a temperature of 220° C. for 120 minutes to obtain copper clad laminates, each including an insulating layer having a thickness of 0.1 mm, 0.4 mm or 0.8 mm (each using one, four or eight prepreg(s)).

Example 2

In the same manner as in Example 1, except that the use amount of the MEK solution (non-volatile component of 50% by weight) of the α-naphthol aralkyl type cyanate ester compound as the cyanate ester compound (B) was changed to 70 parts by weight (35 parts by weight in terms of non-volatile component), and the use amount of the MEK solution (non-volatile component of 75% by weight) of the biphenyl aralkyl type epoxy compound as the epoxy compound (A) was changed to 86.7 parts by weight (65 parts by weight in terms of non-volatile component), a varnish (a solution of a resin composition) was prepared to obtain a copper clad laminate (metal foil clad laminate).

Example 3

In the same manner as in Example 1, except that the use amount of the MEK solution (non-volatile component of 50% by weight) of the α-naphthol aralkyl type cyanate ester compound as the cyanate ester compound (B) was changed to 80 parts by weight (40 parts by weight in terms of non-volatile component), and the use amount of the MEK solution (non-volatile component of 75% by weight) of the biphenyl aralkyl type epoxy compound as the epoxy compound (A) was changed to 80 parts by weight (60 parts by weight in terms of non-volatile component), a varnish (a solution of a resin composition) was prepared to obtain a copper clad laminate (metal foil clad laminate).

Example 4

In the same manner as in Example 1, except that the use amount of the MEK solution (non-volatile component of 50% by weight) of the α-naphthol aralkyl type cyanate ester compound as the cyanate ester compound (B) was changed to 70 parts by weight (35 parts by weight in terms of non-volatile component), and the use amount of the MEK solution (non-volatile component of 75% by weight) of the biphenyl aralkyl type epoxy compound as the epoxy compound (A) was changed to 66.7 parts by weight (50 parts by weight in terms of non-volatile component), and also 15 parts by weight of a naphthalene tetrafunctional epoxy compound represented by formula (7) (HP4710, epoxy equivalent of 240 g/eq., manufactured by DIC Corporation) was mixed in a varnish as the second epoxy compound (A), a varnish (a solution of a resin composition) was prepared to obtain a copper clad laminate (metal foil clad laminate).

Example 5

In the same manner as in Example 4, except that 15 parts by weight of a naphthalene difunctional epoxy compound represented by the formula (6) (HP4032D, epoxy equivalent of 140 g/eq., manufactured by DIC Corporation) was used as the second epoxy compound (A) in place of 15 parts by weight of the naphthalene tetrafunctional epoxy compound, a varnish (a solution of a resin composition) was prepared to obtain a copper clad laminate (metal foil clad laminate).

Example 6

In the same manner as in Example 4, except that 15 parts by weight of an anthraquinone type epoxy compound represented by the formula (9) (YX8800, epoxy equivalent of 180 g/eq., manufactured by Mitsubishi Chemical Corporation) was used as the second epoxy compound (A) in place of 15 parts by weight of the naphthalene tetrafunctional epoxy compound, a varnish (a solution of a resin composition) was prepared to obtain a copper clad laminate (metal foil clad laminate).

Example 7

In the same manner as in Example 2, except that 35 parts by weight of a novolak type cyanate ester compound of the formula (4) in which R is H (PT-30, manufactured by Ronza) was used as the cyanate ester compound (B) in place of the MEK solution of the α-naphthol aralkyl type cyanate ester compound, a varnish (a solution of a resin composition) was prepared to obtain a copper clad laminate (metal foil clad laminate).

Example 8

In the same manner as in Example 2, except that 35 parts by weight of a biphenyl aralkyl type cyanate ester compound of the formula (3) in which R is H and an average of n is 3 to 4 (BA-CN, manufactured by MITSUBISHI GAS CHEMICAL COMPANY, INC.) was used as the epoxy compound (A) in place of the MEK solution of the α-naphthol aralkyl type cyanate ester compound, a varnish (a solution of a resin composition) was prepared to obtain a copper clad laminate (metal foil clad laminate).

Example 9

In the same manner as in Example 2, except that 35 parts by weight of a cyanate ester compound of a xylene-formaldehyde resin of the formula (2a) obtained in Synthesis Example 2 was used as the cyanate ester compound (B) in place of the MEK solution of the α-naphthol aralkyl type cyanate ester compound, a varnish (a solution of a resin composition) was prepared to obtain a copper clad laminate (metal foil clad laminate).

Example 10

In the same manner as in Example 2, except that the use amount of the MEK solution (non-volatile component of 50% by weight) of the α-naphthol aralkyl type cyanate ester compound as the cyanate ester compound (B) was changed to 49 parts by weight (24.5 parts by weight in terms of non-volatile component), and 21 parts by weight (10.5 parts by weight in terms of non-volatile component) of a MEK solution (non-volatile component 50% by weight) of bis(3-ethyl-5-methyl-4-maleimidephenyl)methane (BMI-70, manufactured by KI Chemical Industry Co., Ltd.) was mixed in a varnish as the bismaleimide (D), a varnish (a solution of a resin composition) was prepared to obtain a copper clad laminate (metal foil clad laminate).

Example 11

In the same manner as in Example 10, except that polyphenylmethane maleimide (BMI-2300, manufactured by DAIWA KASEI INDUSTRIAL Co., Ltd.) was used as the bismaleimide (D) in place of bis(3-ethyl-5-methyl-4-maleimidephenyl)methane (BMI-70), a varnish (a solution of a resin composition) was prepared to obtain a copper clad laminate (metal foil clad laminate).

Example 12

In the same manner as in Example 2, except that 50 parts by weight of magnesium hydroxide (average particle diameter of 2.0 μm) (MGZ-6R, Sakai Chemical Industry Co., Ltd.) was further mixed in a varnish as the second inorganic filler (C), a varnish (a solution of a resin composition) was prepared to obtain a copper clad laminate (metal foil clad laminate).

Example 13

In the same manner as in Example 12, except that 50 parts by weight of magnesium oxide (average particle diameter of 0.4 μm) (SMO-0.4, manufactured by Sakai Chemical Industry Co., Ltd.) was used as the second inorganic filler (C) in place of magnesium hydroxide, a varnish (a solution of a resin composition) was prepared to obtain a copper clad laminate (metal foil clad laminate).

Example 14

In the same manner as in Example 12, except that 50 parts by weight of boehmite silica (AOH-60, average particle diameter of 0.9 μm, manufactured by Nabaltec) was used as the second inorganic filler (C) in place of magnesium hydroxide, a varnish (a solution of a resin composition) was prepared to obtain a copper clad laminate (metal foil clad laminate).

Comparative Example 1

In the same manner as in Example 1, except that the use amount of the MEK solution (non-volatile component of 50% by weight) of the α-naphthol aralkyl type cyanate ester compound of the formula (1) as the cyanate ester compound (B) was changed to 40 parts by weight (20 parts by weight in terms of non-volatile component), and the use amount of the MEK solution (non-volatile component of 75% by weight) of the biphenyl aralkyl type epoxy compound of the formula (5) as the epoxy compound (A) was changed to 106.7 parts by weight (80 parts by weight in terms of non-volatile component), a varnish (a solution of a resin composition) was prepared to obtain a copper clad laminate (metal foil clad laminate).

Comparative Example 2

In the same manner as in Example 10, except that the use amount of the MEK solution (non-volatile component of 50% by weight) of the α-naphthol aralkyl type cyanate ester compound of the formula (1) as the cyanate ester compound (B) was changed to 86.8 parts by weight (43.4 parts by weight in terms of non-volatile component), and the use amount of the MEK solution (non-volatile component of 75% by weight) of the biphenyl aralkyl type epoxy compound of the formula (5) as the epoxy compound (A) was changed to 50.7 parts by weight (38 parts by weight in terms of non-volatile component), and also the use amount of the MEK solution (non-volatile component of 50% by weight) of bis(3-ethyl-5-methyl-4-maleimidephenyl)methane as the bismaleimide (D) was changed to 37.2 parts (18.6 parts by weight in terms of non-volatile component), a varnish (a solution of a resin composition) was prepared to obtain a copper clad laminate (metal foil clad laminate).

Comparative Example 3

In the same manner as in Comparative Example 2, except that the α-naphthol aralkyl type cyanate ester compound of the formula (1) as the cyanate ester compound (B) was not used and 70 parts by weight (35 parts by weight in terms of non-volatile component) of a MEK solution (non-volatile component 50% by weight) of a naphthol aralkyl type phenol resin (SN495V2(SN-OH), phenol equivalent of 236 g/eq., manufactured by Nippon Steel Chemical Co., Ltd.) was used in place of it, and also the use amount of the MEK solution (non-volatile component 75% by weight) of the biphenyl aralkyl type epoxy compound of the formula (5) as the epoxy compound (A) was changed to 50.7 parts by weight (50 parts by weight in terms of a non-volatile component) and the use amount of the MEK solution (non-volatile component of 50% by weight) of bis(3-ethyl-5-methyl-4-maleimidephenyl)methane as the bismaleimide (D) was changed to 30 parts by weight (15 parts by weight in terms of non-volatile component), a varnish (a solution of a resin composition) was prepared to obtain a copper clad laminate (metal foil clad laminate).

Comparative Example 4

In the same manner as in Comparative Example 3, except that bis(3-ethyl-5-methyl-4-maleimidephenyl)methane as the bismaleimide (D) was not used, and the use amount of the MEK solution (non-volatile component of 75% by weight) of the biphenyl aralkyl type epoxy compound of the formula (5) as the epoxy compound (A) was changed to 86.7 parts by weight (65 parts by weight in terms of non-volatile component), a varnish (a solution of a resin composition) was prepared to obtain a copper clad laminate (metal foil clad laminate).

3. Evaluation of Resin Composition

Wet Type Roughening Treatment of Copper Clad Laminate and Conductor Layer Plating A surface layer copper foil of each of copper clad laminates, each including an insulating layer having a thickness of 0.1 mm, 0.4 mm or 0.8 mm (each using one, four or eight prepreg(s)), obtained in Examples 1 to 14 and Comparative Examples 1 to 4 was removed by etching, and then immersed in a swelling treatment liquid (OPC-B103 prefetch of 400 ml/L, sodium hydroxide of 13 g/L) manufactured by OKUNO CHEMICAL INDUSTRIES CO., LTD. at 65° C. for 5 minutes. The copper clad laminate was then immersed in a roughening treatment liquid (OPC-1540MN, 100 ml/L, OPC-1200 epoefetch of 100 ml/L) manufactured by OKUNO CHEMICAL INDUSTRIES CO., LTD. at 80° C. for 8 minutes. Finally, a desmear treatment was performed by immersing in a neutralization treatment liquid (OPC-1300 neutralizer of 200 ml/L) manufactured by OKUNO CHEMICAL INDUSTRIES CO., LTD. at 45° C. for 5 minutes. In an electroless copper plating process (name of chemical used: OPC-370 Condiclean M, OPC-SAL M, OPC-80 Catalyst, OPC-555 Accelerator M, ATS Adocopper IW) manufactured by OKUNO CHEMICAL INDUSTRIES CO., LTD., electroless copper plating of about 0.5 μm was then applied, followed by drying at 130° C. for 1 hour. Subsequently, electrolytic copper plating was applied so that the thickness of plated copper becomes 18 followed by drying at 180° C. for 1 hour. Thus, circuit wiring board samples, each including a 18 μm thick conductor layer (plated copper) formed on an insulating layer having a thickness of 0.1 mm, 0.4 mm or 0.8 mm, were produced and then subjected to the following evaluations.

Evaluation Method (1) Adhesion Force of Plated Copper

Using circuit wiring board samples including a 0.4 mm thick insulating layer produced by the above procedure, the adhesion force of the plated copper was measured three times in accordance with JIS C6481, and an average was determined. Regarding samples swollen by drying after electrolytic copper plating, evaluation was performed using the unswollen portion. The results are shown in Tables 1-1 to 1-3.

(2) Moist Heat Resistance

Using circuit wiring board samples including a 0.4 mm thick insulating layer, each sample was cut into a size of 50 mm×50 mm square and then plated copper except for a half of one surface was removed by etching. The sample was treated by a pressure cooker test (PC-3 type, manufactured by HIRAYAMA MANUFACTURING CORP.) at 121° C. under 2 atm for 1, 3 or 5 hour(s) and immersed in a solid bath at 260° C. for 60 seconds, and then it was visually observed whether or not abnormality of a change in appearance exists. Using three samples, a test was performed one by one. A sample with no abnormality was rated "Good (G)", while a sample with swelling was rated "Bad (B)". The results are shown in Tables 1-1 to 1-3. In the tables, "PCT-1H", "PCT-3H" and "PCT-5H" respectively show the results obtained by the pressure cooker test after the treatment for 1, 3 or 5 hour(s).

(3) Surface Roughness

Using circuit wiring board samples including a 0.4 mm thick insulating layer produced by the above procedure, the surface layer copper foil was removed by etching and then subjected to the above desmear treatment, followed by drying at 130° C. for 1 hour. Subsequently, electrolytic copper plating was applied so that the thickness of plated copper becomes 20 followed by drying at 180° C. for 1 hour. Using a laser microscope (VK-X200, manufactured by KEYENCE CORPORATION), Rz (10-point average roughness) of a surface of an insulating layer was determined by an image at magnifications of 3,000 times. The results are shown in Tables 1-1 to 1-3.

(4) Linear Expansion Coefficient

Using circuit wiring board samples including a 0.1 mm thick insulating layer produced by the above procedure, the surface layer copper foil was removed by etching, and then the temperature was raised from 40° C. to 340° C. at a rate of 10° C. per minute by a linear expansion coefficient: thermomechanical analyzer (TA2940, manufactured by TA Instruments) and a linear expansion coefficient at 60° C. to 120° in a plane direction was measured. A longitudinal direction (X) of a glass cloth surface was measured. The results are shown in Tables 1-1 to 1-3.

(5) Glass Transition Temperature

Using circuit wiring board samples including a 0.8 mm thick insulating layer produced by the above procedure, the surface layer copper foil was removed by etching, and then the temperature was raised from 40° C. to 300° C. at a rate of 10° C. per minute by a thermomechanical analyzer (Q800, manufactured by TA Instruments) and the glass transition temperature was measured. The results are shown in Tables 1-1 to 1-3.

TABLE 1-1

| Evaluation results | Example 1 | Example 2 | Example 3 | Example 4 | Example 5 | Example 6 | Example 7 |
|---|---|---|---|---|---|---|---|
| Peel strength of plated copper (kg/cm$^2$) | 0.75 | 0.58 | 0.55 | 0.57 | 0.57 | 0.55 | 0.56 |
| Cross-section roughness Rz (μ) | 2.1 | 2.1 | 2.1 | 2.2 | 2.2 | 2.2 | 2.2 |
| Glass transition temperature DMA (° C.) | 190 | 208 | 220 | 216 | 211 | 214 | 220 |
| Linear expansion coefficient TMA (ppm) | 14.5 | 13.0 | 12.0 | 12.5 | 12.5 | 12.4 | 13.2 |
| Moist heat resistance | | | | | | | |
| PCT-1H | G G G | G G G | G G G | G G G | G G G | G G G | G G G |
| PCT-3H | G G G | G G G | G G G | G G G | G G G | G G G | G G G |
| PCT-5H | G G G | G G G | G G G | G G G | G G G | G G G | G G G |

G = Good,
B = Bad

TABLE 1-2

| Evaluation results | Example 8 | Example 9 | Example 10 | Example 11 | Example 12 | Example 13 | Example 14 |
|---|---|---|---|---|---|---|---|
| Peel strength of plated copper (kg/cm$^2$) | 0.60 | 0.56 | 0.60 | 0.60 | 0.75 | 0.73 | 0.53 |
| Cross-section roughness Rz (μ) | 2.2 | 2.2 | 2.2 | 2.2 | 2.3 | 2.2 | 2.1 |
| Glass transition temperature DMA (° C.) | 210 | 207 | 225 | 235 | 209 | 210 | 210 |
| Linear expansion coefficient TMA (ppm) | 13.5 | 13.6 | 12.8 | 12.6 | 12.3 | 12.2 | 12.0 |
| Moist heat resistance | | | | | | | |
| PCT-1H | G G G | G G G | G G G | G G G | G G G | G G G | G G G |
| PCT-3H | G G G | G G G | G G G | G G G | G G G | G G G | G G G |
| PCT-5H | G G G | G G G | G G G | G G G | G G G | G G G | G G G |

G = Good,
B = Bad

TABLE 1-3

| Evaluation results | Comparative Example 1 | Comparative Example 2 | Comparative Example 3 | Comparative Example 4 |
|---|---|---|---|---|
| Peel strength of plated copper (kg/cm$^2$) | 0.80 | 0.10 | 0.42 | 0.62 |
| Cross-section roughness Rz (μ) | 2.1 | 2.0 | 3.5 | 3.8 |
| Glass transition temperature DMA (° C.) | 150 | 260 | 200 | 155 |
| Linear expansion coefficient TMA (ppm) | 16.0 | 11.0 | 12.3 | 13.2 |
| Moist heat resistance | | | | |
| PCT-1H | B B B | G G G | G G G | B B B |
| PCT-3H | B B B | B B B | G G B | B B B |
| PCT-5H | B B B | B B B | G G B | B B B |

G = Good, B = Bad

As is apparent from the results shown in Tables 1-1 to 1-3, the copper clad laminates including the insulating layer formed using the resin composition of the present invention according to Examples 1 to 15 have small surface roughness and have high plating peel strength and high glass transition temperature, and is also excellent in moist heat resistance, as compared with those of Comparative Examples.

INDUSTRIAL APPLICABILITY

As mentioned above, the resin composition of the present invention is extremely useful as a material of an insulating layer of a printed wiring board since it exerts various effects such as excellent adhesion between an insulating layer and a plated conductor layer, and excellent heat resistance when used as the material of the insulating layer of the printed wiring board.

The invention claimed is:

1. A resin composition which is used as a material of an insulating layer of a printed wiring board including the insulating layer, and a conductor layer formed by plating on a surface of the insulating layer, comprising
an epoxy compound (A),
a cyanate ester compound (B) and
an inorganic filler (C),
wherein the epoxy compound (A) is at least one selected from the group consisting of a biphenyl aralkyl type epoxy compound, a naphthalene type epoxy compound, a bisnaphthalene type epoxy compound, an anthraquinone type epoxy compound, a naphthol aralkyl type epoxy compound and a xylock type epoxy compound;
wherein the cyanate ester compound (B) is at least one selected from the group consisting of a naphthol aralkyl type cyanate ester compound, an aromatic hydrocarbon formaldehyde type cyanate ester compound, and a biphenyl aralkyl type cyanate ester compound, and
the content of the epoxy compound (A) is 60 to 75% by weight based on the total amount of the epoxy compound (A) and the cyanate ester compound (B).

2. The resin composition according to claim 1, wherein the content of the epoxy compound (A) is 65 to 75% by weight based on the total amount of the epoxy compound (A) and the cyanate ester compound (B).

3. The resin composition according to claim 1, wherein the naphthol aralkyl type cyanate ester compound is represented by formula (1), the aromatic hydrocarbon formaldehyde type cyanate ester compound is represented by formula (2), and the the biphenyl aralkyl type cyanate ester compound is represented by formula (3):

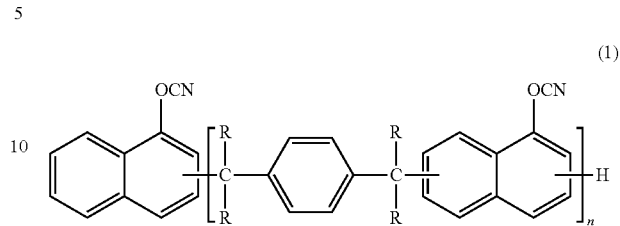

wherein each R independently represents a hydrogen atom or a methyl group, and n represents an integer of one or more;

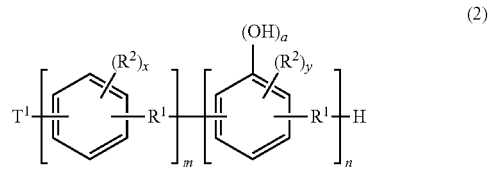

wherein
each $R^1$ independently represents a methylene group, a methyleneoxy group, a methyleneoxymethylene group or an oxymethylene group,
each $R^2$ independently represents a C1-3 alkyl group, a hydroxyl group or a hydroxymethylene group,
$T^1$ represents a hydrogen atom, a hydroxyl group or a hydroxymethylene group,
each x independently represents an integer of 0 to 4,
y each independently represents an integer of 0 to 3,
m represents an integer of 0 or more, and
n represents an integer of one or more;

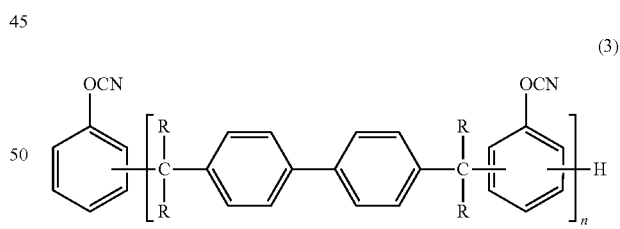

wherein each R independently represents a hydrogen atom or a methyl group, and n represents an integer of one or more.

4. The resin composition according to claim 1, wherein the biphenyl aralkyl type epoxy compound is represented by formula (5), the naphthalene type epoxy compound is represented by formula (6), the bisnaphthalene type epoxy compound is represented by formula (7), the anthraquinone type epoxy compound is represented by formula (9), the naphthol aralkyl type epoxy compound is represented by formula (10), and the xylock type epoxy compound is represented by formula (11):

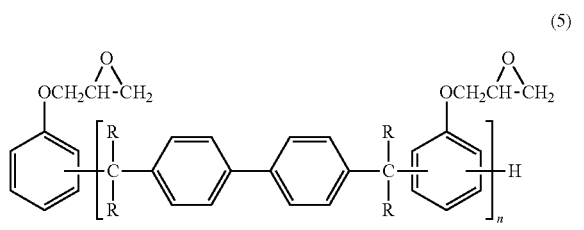

wherein n represents an integer of one or more:

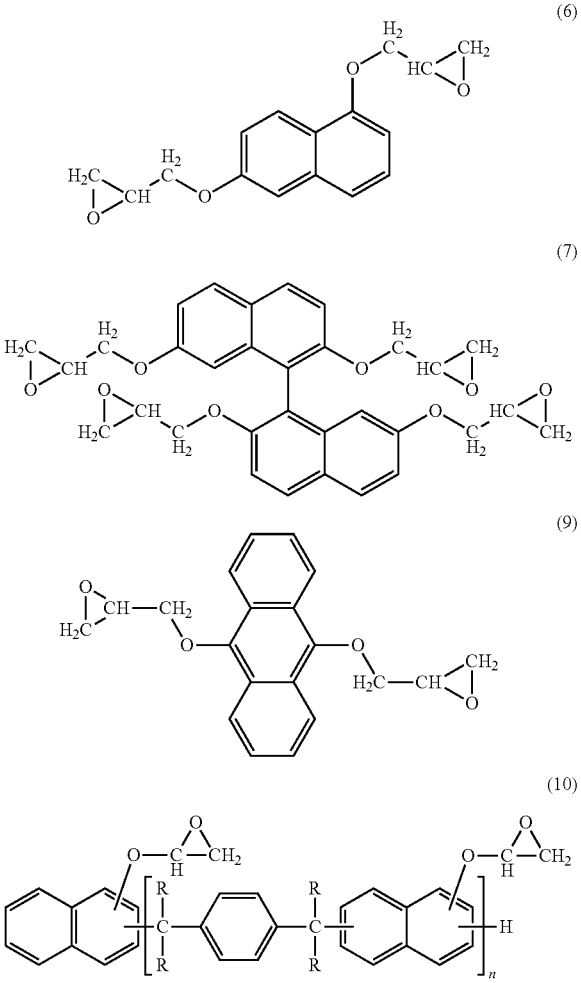

wherein each R independently represents a hydrogen atom or a methyl group, and n represents an integer of one or more; and

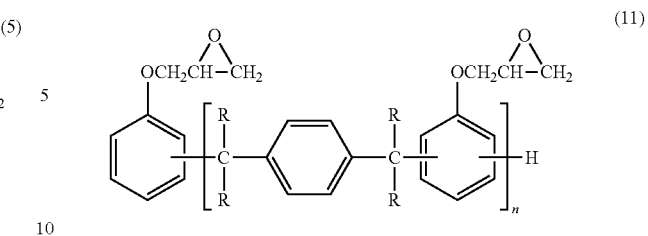

wherein each R independently represents a hydrogen atom or a methyl group, and n represents an integer of one or more.

5. The resin composition according to claim 1, wherein the inorganic filler (C) is at least one selected from the group consisting of silica, aluminum hydroxide, boehmite, magnesium oxide and magnesium hydroxide.

6. The resin composition according to claim 1, wherein the content of the inorganic filler (C) is 50 to 250% by weight based on the total amount of the epoxy compound (A) and the cyanate ester compound (B).

7. The resin composition according to claim 1, further comprising a bismaleimide (D).

8. The resin composition according to claim 7, wherein the content of the bismaleimide (D) is 5 to 20% by weight based on the total amount of the epoxy compound (A) and the cyanate ester compound (B).

9. A prepreg comprising a base material, and the resin composition according to claim 1 attached to the base material.

10. A resin sheet comprising an external layer made of a metal foil or a metal film, and a layer of the resin composition according to claim 1 laminated on the external layer.

11. A metal foil-clad laminate comprising the prepreg according to claim 9, and a metal foil laminated on one or both surface(s) of the prepreg.

12. The metal foil clad laminate according to claim 11, wherein surface roughness Rz of a matte surface of the metal foil is 1.0 μm to 2.5 μm.

13. A printed wiring board produced by using the prepreg according to claim 9 as a build-up material.

14. A printed wiring board produced by using the resin sheet according to claim 10 as a build-up material.

15. The printed wiring board according to claim 14, which is produced by subjecting the resin sheet to a surface treatment, followed by plating to form a pattern.

16. A printed wiring board produced by using the metal foil clad laminate according to claim 11 as a build-up material.

17. The printed wiring board according to claim 16, which is produced by etching the metal foil of the metal foil clad laminate, followed by subjecting it to a surface treatment and further plating to form a pattern.

18. A printed wiring board comprising an insulating layer, and a conductor layer formed on a surface of the insulating layer, wherein the insulating layer contains the resin composition according to claim 1.

* * * * *